United States Patent [19]

Hashimoto

[11] Patent Number: 4,999,814

[45] Date of Patent: Mar. 12, 1991

[54] DYNAMIC MEMORY WITH INTERNAL REFRESH CIRCUIT AND HAVING VIRTUALLY REFRESH-FREE CAPABILITY

[75] Inventor: Masashi Hashimoto, Ami, Japan

[73] Assignee: Texas Instruments Incorporated, Dallas, Tex.

[21] Appl. No.: 83,555

[22] Filed: Aug. 7, 1987

[30] Foreign Application Priority Data

Aug. 13, 1986 [JP] Japan .................. 61-189992

[51] Int. Cl.$^5$ .............................................. G11C 7/00
[52] U.S. Cl. .................................. 365/222; 365/221; 365/189.05; 365/189.12
[58] Field of Search ............... 365/233, 222, 221, 236, 365/240, 239, 78, 189.05, 189.12

[56] References Cited

U.S. PATENT DOCUMENTS

| | | | |
|---|---|---|---|
| 4,549,284 | 10/1985 | Ikuzaki | 365/222 |
| 4,622,668 | 11/1986 | Dancker et al. | 365/222 X |
| 4,672,583 | 6/1987 | Nakaizumi | 365/222 |
| 4,688,196 | 8/1987 | Inagaki et al. | 365/222 |
| 4,701,884 | 10/1987 | Aoki et al. | 365/221 X |

OTHER PUBLICATIONS

"A 1 Mb DRAM With 33 MHz Serial I/O Ports", Ohta et al., IEEE International Solid-State Circuits Conference, pp. 274-275 (Feb. 21, 1986) with related product description 1Mbit Image Memory MN4700 Product Description.

"1985 Memory Products Data Book", NEC Electronics Inc., PD41221 224,000-Bit Serial-Access NMOS RAM, pp. 3-21 through 3-25 (Jan. 1985).

"1986 Memory Data Book", NEC Electronics Inc., PD41221 224,000-Bit Serial-Access NMOS RAM, pp. 3-25 through 3-31 (Apr. 1986).

Tunick, Electronic Design Report, Rich With Logic, Memory ICs Have Their Specialties, Jun. 11, 1987.

*Primary Examiner*—Stuart N. Hecker
*Assistant Examiner*—Andrew L. Sniezek
*Attorney, Agent, or Firm*—William E. Hiller; N. Rhys Merrett; Melvin Sharp

[57] ABSTRACT

Semiconductor memory device including a dynamic memory array having a plurality of dynamic memory cells arranged in a matrix of rows and columns, write line and read line buffer memories disposed at the input and output of the dynamic memory array, and internal control circuitry including an internal refresh circuit and an internal arbiter circuit for determining relative priority as between write, read, and refresh request signals such that the internal refresh circuit is enabled to generate a refresh request signal for periodically applying a refresh signal to the dynamaic memory cells of the dynamic memory array without requiring an external control signal for implementation of the refresh request signal. In a particular aspect, the write line buffer memory and the read line buffer memory are respectively divided into first and second sections for alternate tandem operation in relation to one-half row of dynamic memory cells of the dynamic memory array so as to provide for continuous serial data input to the dynamic memory array via the alternate tandem operation of the first and second write line buffer memory sections and continuous serial data output from the dynamic memory array without interruption from the refresh mode during its operation cycle via the alternate tandem operation of the first and second read line buffer memory sections with respect to one-half row of dynamic memory cells of the dynamic memory array.

8 Claims, 2 Drawing Sheets

DYNAMIC MEMORY WITH INTERNAL REFRESH CIRCUIT AND HAVING VIRTUALLY REFRESH-FREE CAPABILITY

BACKGROUND OF THE INVENTION

1. Field of the Invention

The present invention relates to a semiconductor memory device, for example, one in which a dynamic memory is used for the main memory thereof.

2. Description of the Prior Art

The DRAM (Dynamic Random Access Memory) of prior art that makes use of a dynamic memory has always been designed as a device that requires repeated refreshing to keep data stored for the necessary duration of time.

However, such refresh control has been a task the user is responsible for, so the user must design a proper refresh control circuit at the stage of system design. This is a burden on the user. Such control circuit operates solely under control of a signal given from exterior. Further, the refresh mode in which data can neither be read nor rewritten lowers the efficiency of DRAM utilization.

OBJECTS AND SUMMARY OF THE INVENTION

It is an object of the invention to provide a semiconductor memory device that can be refreshed efficiently with no burden at all on the user.

Namely, the invention relates to a semiconductor memory device that comprises a memory and a means to refresh such memory by an internal circuit without recourse to any external signal control.

Other objects, features, and advantages of the invention will appear more fully from the following detailed description thereof taken in connection with the accompanying drawings.

DESCRIPTION OF THE PREFERRED EMBODIMENTS

Figure 1:
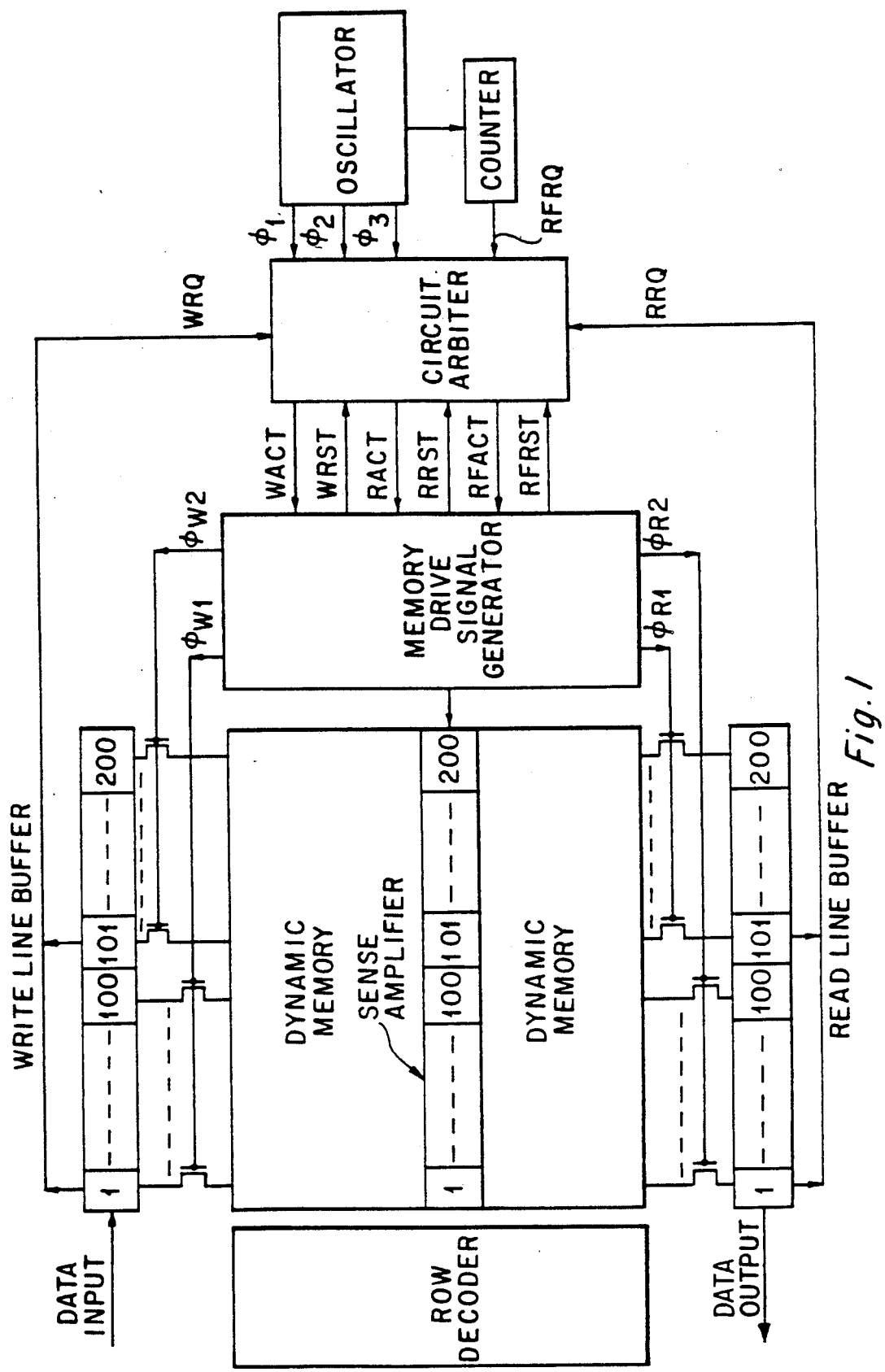
FIG. 1 is a circuit diagram of a semiconductor memory device embodying the invention.

FIG. 1 shows the circuit configuration of a semiconductor memory device embodying the invention.

Basically, this memory device is equipped with a pair of line buffers for serial-parallel and parallel-serial conversion of write and read data, a ring oscillator or an oscillator circuit similar thereto, a counter to count oscillation pulses from such oscillator, a mechanism to generate the write and read requests, a circuit to generate the refresh request signal, and an arbiter circuit that determines priority between read, write and refresh request signals depending on particular circumstances.

In FIG. 1, for sake of descriptional convenience, it is assumed that 200 parallel sense amplifiers are provided in the direction of row of dynamic memory elements with the write line buffer and read line buffer connected to these sense amplifiers for parallel input and output, respectively. There is continuous input of serial data to the write line buffer with serial data read out from the read line buffer for continuous output. For both of these input and output circuits, any known means for serial data input or output with an exclusive addressing circuit built in may be used. Such input and output circuits can also be materialized otherwise by an approach as applied to the VRAM (Video RAM), etc. Accordingly, the operation of line buffers is omitted from the following description of this specification.

Data is written by the following sequence of steps (1) to (6).

(1) Data is written into the write line buffer sequentially as these data is input serially from outside. Here a serial write clock may be used to operate the pointer for address control of input data. At the start of the 101th data write cycle after the 100th data has been written, a write request signal WRQ (=1=true) is generated to write data Nos. 1 to 100 stored in the write line buffer into the dynamic memory elements.

Figure 2:
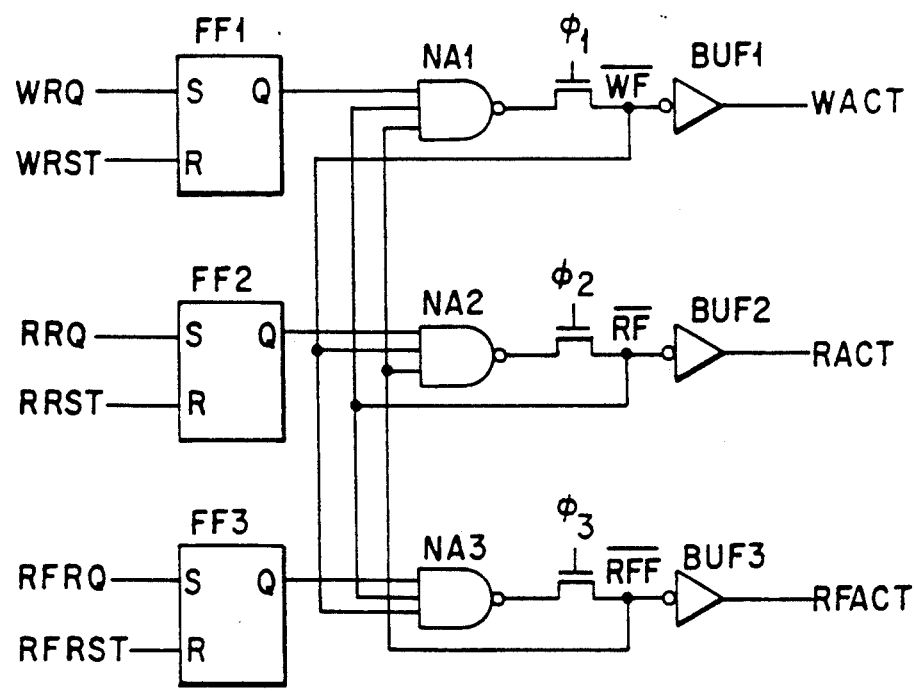
FIG. 2 is an equivalent circuit diagram of the major part of an arbiter circuit used in such device.
Figure 3:
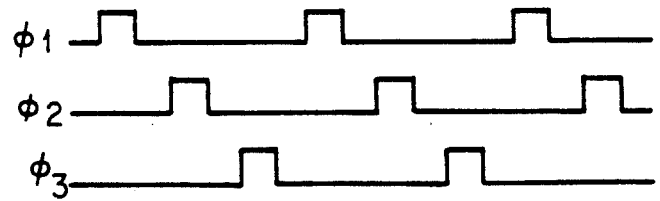
FIG. 3 is a timing chart of control signals from the above arbiter circuit.

(2) The signal WRQ is applied to the set terminal of the flip-flop FF1 of arbiter circuit as shown in FIG. 2. As the WRQ becomes true, the output terminal Q of FF1 is also set true. If the output Q of FF1 becomes true with both $\overline{RF}$ and $\overline{RFF}$ true, the output of NA1 is false (=0), so $\overline{WF}$ is also set false at the timing $\phi 1$. The write control signal WACT and also a memory driver signal $\phi w1$ are thus set true. The condition under which both RF and RFF are true will be mentioned later. It is noted that the circuit is designed in such a manner that $\phi w1$, $\phi w2$, $\phi R1$ and $\phi R2$ are normally false As the WACT is set true after the write pointer has counted up to 101 or counted up to 200 and then returned back to 0, $\phi w1$ or $\phi w2$, respectively, gets true. Similarly, $\phi R1$ or $\phi R2$ are set true when the read pointer reaches 101 or 0, respectively.

(3) As the WACT gets true, this signal is transmitted to the dynamic memory drive signal generator. Data is then written in the memory by the same operation as applied when data is written in the ordinary DRAM.

(4) After data is written, the dynamic memory drive signal generator generates a signal WRST (=1=true) to reset the WACT.

(5) This WRST is then applied to the reset signal input terminal of FF1, returning Q back to the false state 0. As a result, the WF returns back to the true state 1 at the timing $\phi 1$.

(6) After the data No. 200 has been written, the write pointer returns back to the address No. 1 to write data from this address and at the same time a signal WRQ is generated to set the WACT and $\phi w2$ true by the same procedure.

Data is thus continuously written.

To read out data, data Nos. 1 to 100 are stored beforehand to the read line buffer and a read request signal RRQ is generated at the timing when the data No. 1 is read out. If both $\overline{WF}$ and $\overline{RFF}$ are true, $\overline{RF}$ then becomes false at the timing $\phi 2$ to set the RACT and $\phi R1$ true starting an operational sequence to output data Nos. 101 to 200 to the read line buffer. Through a similar operational sequence, a series of input data can be continuously read out.

For refreshing, the frequency of oscillator is divided by a proper counter to repeatedly generate a refresh request signal RFRQ at a proper cycle.

Next, let us see why the approach as mentioned above has so far not been applied to the DRAM or the like. At the same time, points that are important in embodying the invention will also been mentioned.

The read and write timing control of DRAM has hitherto been a task that must be solved by the user himself. It is therefore not possible to forecast when write and read control signals are generated. Accordingly, as obvious from the circuits of FIG. 2, in the memory circuit configuration in which the approach of the present invention to generate the refresh request signal internally is used, once the refresh mode is started, any other request that may occur cannot be responded immediately but must wait until the ongoing refresh mode is completed. Since this leads to an increase in the access time, the above approach has not been feasible. If data is accessed serially, however, it is possible to forecast when necessary data appears. If line buffers are built in to write and read data in batches of adequate size and if necessary data is, for example, read not by directly accessing the dynamic memory that operates rather slowly but serially through a line buffer fast enough, there will be no practical difficulty in reading data, for example, if a read request signal is generated during the refresh mode and therefore data reading is started after the end of ongoing refresh mode.

For example, let us assume 30 nsec for the maximum bit rate for serial data writing or reading and 300 nsec for the cycle time to read, write or refresh data in the dynamic memory. For example, if write, refresh and read requests to write, refresh and read, respectively, data in the dynamic memory are generated simultaneously for execution in this order, necessary data will always have been written in the read line buffer 900 nsec later. To get necessary data, therefore, it will be enough to generate a read request signal 30 bits or more earlier than when such data is input. Namely, if the line buffer is designed for a storage capacity of 60 bits (30 bits×2), the memory will work without any interruption in data reading.

If line buffers having a bit capacity based on a similar calculation are built in, therefore, a practically refresh-free memory of serial data access type will be materialized.

It will be evident that various modifications can be made to the described embodiments without departing from the scope of the present invention.

For example, data read and write which are executed unsynchronously in the above example may be synchronized by an external clock. Further, the line buffers are each composed of buffer elements configured in series but data Nos. 1 to 100 and 101 to 200 comprising each line buffer may be provided in parallel configuration.

In the present invention, as mentioned above, the refresh operation is provided by an internal circuit without use of any external signal. This provides an efficient memory device that need not interrupt data processing even during refresh mode and yet does not give the user any burden to design the refresh control circuit.

What is claimed is:

1. A semiconductor memory device comprising:
dynamic memory array means including a plurality of dynamic memory cells arranged in a matrix of rows and columns and having an input and an output;
write line buffer memory means having first and second write line buffer memories disposed at the input of said dynamic memory array means for serial-parallel conversion of write data as input therefrom into the dynamic memory cells of said dynamic memory array means;
read line buffer memory means having first and second read line buffer memories disposed at the output of said dynamic memory array means for parallel-serial conversion of read data as output from the dynamic memory cells of said dynamic memory array means;
sense amplifier means having first and second sense amplifier sections operably connected to said dynamic memory array means and connected in parallel to said write line buffer memory means and said read line buffer memory means respectively, each of said first and second sense amplifier sections including a plurality of sense amplifiers corresponding in number to the dynamic memory cells defining a respective one-half row of dynamic memory cells of said dynamic memory array means;
said first sense amplifier section being respectively connected in parallel to said first write line buffer memory and said first read line buffer memory and to one-half row of dynamic memory cells of said dynamic memory array means;
said second sense amplifier section being respectively connected in parallel to said second write line buffer memory and said second read line buffer memory and to the remaining one-half row of dynamic memory cells of said dynamic memory array means;
control circuit means connected to said dynamic memory array means, said write line buffer memory means, said read line buffer memory means, and said sense amplifier means for regulating data transfer so that said first and second write line buffer memories and said first and second read line buffer memories are respectively operable in tandem with said first and second sense amplifier sections respectively in inputting data to and outputting data from said dynamic memory array means;
said control circuit means including an internal write/read signal generator means operably connected to said dynamic memory array means, said write line buffer memory means, said read line buffer memory means, and said sense amplifier means for generating respective write request signals and read request signals to which said write line buffer memory means and said read line buffer memory means are individually responsive in performing data transfer with said dynamic memory array means;
internal refresh circuit means for generating a refresh request signal to enable a refresh signal to be periodically applied to said dynamic memory cells of said dynamic memory array means;
internal arbiter circuit means operatively connected to said write/read signal generator means and to said refresh circuit means for determining relative priority between said write, read, and refresh request signals;
said first write line buffer memory and said second write line buffer memory alternately receiving serial input data and transferring input data to one-half row of dynamic memory cells of said dynamic memory array means in response to a write request signal, one of said first and second write line buffer memories receiving serial input data, while the other of said first and second write line buffer memories has the capability of writing data into one-half row of dynamic memory cells of said dynamic memory array means at the same time;

said first read line buffer memory and said second read line buffer memory alternately accepting read data from one-half row of dynamic memory cells of said dynamic memory array means and providing a serial read data output, one of said first and second read line buffer memories receiving read data from one-half row of said dynamic memory cells of said dynamic memory array means, while the other of said first and second read line buffer memories has the capability of providing a serial read data output corresponding to the remaining one-half row of said dynamic memory cells of said dynamic memory array means at the same time; and the storage capacities of said first and second write line buffer memories and said first and second read line buffer memories being sufficiently large to enable the memory device to perform a read data output continuously without interruption upon the condition that read data is present in one of said first and second read line buffer memories at a time when a read request signal in the operational cycle is available to be acted upon by said first and second read line buffer memories, whereby a substantially refresh-free serial data access memory is provided.

2. A semiconductor memory device as set forth in claim 1, further including:

memory drive signal generator means interposed between said dynamic memory array means and said arbiter circuit means, said memory drive signal generator means being connected to said dynamic memory array means, said write line buffer memory means, said read line buffer memory means, said sense amplifier means, and said arbiter circuit means and being responsive to first, second, and third control signals from said arbiter circuit means generated in response to write, read, and refresh request signals respectively to initiate data transfer operation cycles and a refresh cycle with respect to said dynamic memory array means.

3. A semiconductor memory device as set forth in claim 2, wherein said internal refresh circuit means comprises:

oscillator means for generating oscillation pulses; and
counter means connected to said oscillator means for counting the oscillation pulses generated thereby and automatically generating a refresh request signal in response to a predetermined number of oscillation pulses;
said counter means being connected to said arbiter circuit means for providing said refresh request signal as an input thereto.

4. A semiconductor memory device as set forth in claim 3, wherein said oscillator means is connected to said arbiter circuit means and comprises a multi-phase clock for determining when said first, second, and third control signals from said arbiter circuit means corresponding to the write, read, and refresh request signals are generated by said arbiter circuit means for input to said memory drive signal generator means.

5. A semiconductor memory device comprising:
a dynamic memory array including a plurality of dynamic memory cells arranged in a matrix of rows and columns and having an input and an output;
a write line buffer memory disposed at the input of said dynamic memory array for serial-parallel conversion of write data as input therefrom into the dynamic memory cells of said dynamic memory array;
a read line buffer memory disposed at the output of said dynamic memory array for parallel-serial conversion of read data as output from the dynamic memory cells of said dynamic memory array into said read line buffer memory;
internal write/read signal generator means operatively connected to said dynamic memory array, said write line buffer memory, and said read line buffer memory for generating respective write request signals and read request signals to which said write line buffer memory and said read line buffer memory are individually responsive in performing data transfer with said dynamic memory array;
internal refresh circuit means for generating a refresh request signal to enable a refresh signal to be periodically applied to said dynamic memory cells of said dynamic memory array;
internal arbiter circuit means operatively connected to said write/read signal generator means and to said refresh circuit means for determining relative priority between said write, read, and refresh request signals;
continuously input data being receivable as serial input data by said write line buffer memory, and continuously read out data being providable as serial output data from said read line buffer memory; and
said write line buffer memory and said read line buffer memory being provided with a bit storage capacity of sufficient size such that the simultaneous generation of write, read, and refresh request signals can be accommodated without interrupting data read out from said read line buffer memory to perform a refresh of said dynamic memory cells of said dynamic memory array in response to the refresh request signal, whereby a substantially refresh-free serial data access memory is provided.

6. A semiconductor memory device comprising:
a dynamic memory array including a plurality of dynamic memory cells arranged in a matrix of rows and columns and having an input and an output;
a write line buffer memory disposed at the input of said dynamic memory array for serial-parallel conversion of write data as input therefrom into the dynamic memory cells of said dynamic memory array;
a read line buffer memory disposed at the output of said dynamic memory array for parallel-serial conversion of read data as output from the dynamic memory cells of said dynamic memory array into said read line buffer memory;
internal write/read signal generator means operably connected to said dynamic memory array, said write line buffer memory, and said read line buffer memory for generating respective write request signals and read request signals to which said write line buffer memory and said read line buffer memory are individually responsive in performing data transfer with said dynamic memory array;
internal refresh circuit means for generating a refresh request signal to enable a refresh signal to be periodically applied to said dynamic memory cells of said dynamic memory array;
internal arbiter circuit means operably connected to said write/read signal generator means and to said refresh circuit means for determining relative priority between said write, read, and refresh request signals;

memory drive signal generator means interposed between said dynamic memory array and said arbiter circuit means, said memory drive signal generator means being connected to said dynamic memory array, said write line buffer memory, said read line buffer memory and said arbiter circuit means and being responsive to first, second, and third control signals from said arbiter circuit means generated in response to write, read, and refresh request signals respectively to initiate data transfer operation cycles and a refresh cycle with respect to said dynamic memory array;

continuously input data being receivable as serial input data by said write line buffer memory, and continuously read out data being providable as serial output data from said read line buffer memory; and said write line buffer memory and said read line buffer memory being provided with a bit storage capacity of sufficient size such that the simultaneous generation of write, read, and refresh request signals can be accommodated without interrupting data read out from said read line buffer memory to perform a refresh of said dynamic memory cells of said dynamic memory array in response to the refresh request signal, whereby a substantially refresh-free serial data access memory is provided.

7. A semiconductor memory device as set forth in claim 6, wherein said internal refresh circuit means comprises:

oscillator means for generating oscillation pulses; and counter means connected to said oscillator means for counting the oscillation pulses generated thereby and automatically generating a refresh request signal in response to a predetermined number of oscillation pulses;

said counter means being connected to said arbiter circuit means for providing said refresh request signal as an input thereto.

8. A semiconductor memory device as set forth in claim 7, wherein said oscillator means is connected to said arbiter circuit means and comprises a multi-phase clock for determining when said first, second, and third control signals from said arbiter circuit means corresponding to the write, read, and refresh request signals are generated by said arbiter circuit means for input to said memory drive signal generator means.

* * * * *